US012622024B2

(12) United States Patent
Tang

(10) Patent No.: US 12,622,024 B2
(45) Date of Patent: May 5, 2026

(54) SEMICONDUCTOR MEMORY STRUCTURE WITH L-SHAPED CHANNEL AND METHOD FOR MANUFACTURING THE SAME

(71) Applicant: CHANGXIN MEMORY TECHNOLOGIES, INC., Hefei City (CN)

(72) Inventor: Yi Tang, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 400 days.

(21) Appl. No.: 18/510,855

(22) Filed: Nov. 16, 2023

(65) Prior Publication Data

US 2024/0145545 A1      May 2, 2024

Related U.S. Application Data

(63) Continuation of application No. PCT/CN2022/131127, filed on Nov. 10, 2022.

(30) Foreign Application Priority Data

Nov. 1, 2022    (CN) .......................... 202211357775.5

(51) Int. Cl.
*H10D 62/17*          (2025.01)
*H10D 1/68*          (2025.01)
(Continued)

(52) U.S. Cl.
CPC ............. *H10D 62/292* (2025.01); *H10D 1/68* (2025.01); *H10D 30/611* (2025.01); *H10D 64/519* (2025.01)

(58) Field of Classification Search
CPC ...... H10D 62/292; H10D 1/68; H10D 30/611; H10D 64/519; H10B 12/00; H10B 41/10; H10B 41/27; H10B 43/10; H10B 43/27
See application file for complete search history.

(56) References Cited

U.S. PATENT DOCUMENTS 7,867,831 B2    1/2011  Shin
8,203,177 B2    6/2012  Shin
(Continued)

FOREIGN PATENT DOCUMENTS

CN        110875184 A      3/2020
CN        113241347 A      8/2021
(Continued)

OTHER PUBLICATIONS

International Search Report in the international application No. PCT/CN2022/131127, mailed on Feb. 22, 2023. 3 pages.

*Primary Examiner* — John P. Dulka
(74) *Attorney, Agent, or Firm* — Syncoda LLC; Feng Ma

(57)          ABSTRACT

The semiconductor structure comprises: semiconductor channels, first gate structures, second gate structures and bit lines. Each semiconductor channel extends in a third direction and has an L-shaped cross-section in a plane perpendicular to the third direction, each of the semiconductor channels comprises a first L-shaped sidewall and a second L-shaped sidewall which are opposite to each other and extend in the third direction, the first L-shaped sidewall comprises a first face extending in a first direction and a second face extending in a second direction. Each first gate structure is in contact with the first face. Each second gate structures is in contact with the second face, each first gate structure is in contact with the respective second gate structure. The bit lines extend in the second direction and are located on a side of each of the semiconductor channels in the third direction.

20 Claims, 9 Drawing Sheets

(51) Int. Cl.
   *H10D 30/60*            (2025.01)
   *H10D 64/27*            (2025.01)

(56)                    References Cited

U.S. PATENT DOCUMENTS

|  |  |  |  |  |  |
|---|---|---|---|---|---|
| 8,338,874 | B2 | 12/2012 | Shin | | |
| 11,037,936 | B2 | 6/2021 | Zhou | | |
| 2009/0296476 | A1 | 12/2009 | Shin | | |
| 2010/0308398 | A1 | 12/2010 | Shin | | |
| 2012/0217572 | A1 | 8/2012 | Shin | | |
| 2020/0075603 | A1 | 3/2020 | Zhou | | |
| 2021/0242218 | A1 | 8/2021 | Zhou | | |
| 2022/0115507 | A1* | 4/2022 | Choi | .................... | H10D 64/252 |
| 2024/0064954 | A1* | 2/2024 | Yang | .................... | H10B 12/482 |

FOREIGN PATENT DOCUMENTS

|  |  |  |  |  |  |
|---|---|---|---|---|---|
| CN | 114709168 | A | 7/2022 | | |
| CN | 115020473 | A | 9/2022 | | |
| KR | 20190136788 | A | * 12/2019 | .......... | H01L 27/1157 |

* cited by examiner

SEMICONDUCTOR MEMORY STRUCTURE WITH L-SHAPED CHANNEL AND METHOD FOR MANUFACTURING THE SAME

CROSS-REFERENCE TO RELATED APPLICATION

This is a continuation application of International Patent Application No. PCT/CN2022/131127, filed on Nov. 10, 2022, which claims priority to Chinese patent application No. 202211357775.5, filed on Nov. 1, 2022 and entitled "SEMICONDUCTOR STRUCTURE AND METHOD FOR MANUFACTURING THE SAME". The disclosures of International Patent Application No. PCT/CN2022/131127 and Chinese patent application No. 202211357775.5 are incorporated by reference herein in their entireties.

TECHNICAL FIELD

The present disclosure relates to the field of semiconductor technologies, and in particular to a semiconductor structure and a method for manufacturing the semiconductor structure.

BACKGROUND

With the development of semiconductor structures, the critical dimensions of the semiconductor structures are decreasing. However, due to the restriction of lithography machines, there is a limit to the scaling down of the critical dimensions of the semiconductor structures. Therefore, the researchers and practitioners in the semiconductor field are committed to manufacturing a chip with higher storage density by a wafer. In the two-dimensional or planar semiconductor devices, the memory cells are arranged in the horizontal direction. Thus the integration density of the two-dimensional or planar semiconductor device can be determined by the area occupied by a unit memory cell, and the integration density of the two-dimensional or planar semiconductor devices is greatly influenced by the technologies of forming fine patterns, which causes the limitation to the continuous increasing of the integration density of the two-dimensional or planar semiconductor devices. Therefore, the semiconductor devices are developing towards three-dimensional semiconductor devices.

However, with the increasing of the integration density of the semiconductor structure, the reduced spacing between adjacent memory cells causes that the adjacent memory cells are prone to interfere with each other, thereby leading to a deterioration of the electrical performance of the semiconductor structure. Thus it is difficult to achieve a balance between the integration density and the electrical performance of the semiconductor structure.

SUMMARY

According to some embodiments of the present disclosure, one aspect of the embodiments of the present disclosure provides a semiconductor structure, including: semiconductor channels extending in a third direction, first gate structures, second gate structures and bit lines. Each of the semiconductor channels has an L-shaped cross-section in a plane perpendicular to the third direction, each of the semiconductor channels includes a first L-shaped sidewall and a second L-shaped sidewall which are opposite to each other and extend in the third direction, the first L-shaped sidewall includes a first face extending in a first direction and a second face extending in a second direction. Each of the first gate structures is in contact with the first face. Each of the second gate structures is in contact with the second face. Each of the first gate structures is in contact with a respective one of the second gate structures, and forms a combined structure together with the respective one of the second gate structures. The combined structure has an L-shaped cross-section in the plane perpendicular to the third direction. The bit lines extend in the second direction and are located on a side of each of the semiconductor channels in the third direction. The first direction, the second direction and the third direction intersect with each other.

According to some embodiments of the present disclosure, another aspect of the embodiments of the present disclosure provides a manufacturing method for a semiconductor structure, including operations of: forming semiconductor channels extending in a third direction, in which each of the semiconductor channels has an L-shaped cross-section in a plane perpendicular to the third direction, each of the semiconductor channels includes a first L-shaped sidewall and a second L-shaped sidewall which are opposite to each other and extend in the third direction, the first L-shaped sidewall includes a first face extending in a first direction and a second face extending in a second direction; forming first gate structures and second gate structures which are in contact with each other, in which each of the first gate structure is in contact with the first face, each of the second gate structure is in contact with the second face, and forms a combined structure together with a respective one of the second gate structures, the combined structure has an L-shaped cross-section in the plane perpendicular to the third direction; and forming bit lines extending in the second direction and located on a side of each of the semiconductor channels in the third direction. The first direction, the second direction and the third direction intersect with each other.

BRIEF DESCRIPTION OF THE DRAWINGS

One or more embodiments are exemplified by the figures in the corresponding drawings, and these exemplary descriptions do not constitute limitations of the embodiments. Unless otherwise stated, the figures in the drawings do not constitute a scale limitation. In order to illustrate the technical solutions in the embodiments of the disclosure or conventional technologies more clearly, the drawings used in the embodiments will be briefly described below. It is apparent that the drawings in the following descriptions are merely some embodiments of the disclosure. Other drawings can be assumed by those skilled in the art according to these drawings without any creative work.

DETAILED DESCRIPTION

The embodiments of the present disclosure provide a semiconductor structure and a manufacturing method thereof. In the semiconductor structure, a cross-section of a semiconductor channel is L-shaped in a plane perpendicular to a third direction. In this way, in case that a plurality of semiconductor channels are arranged, the L-shaped cross-section of each of the semiconductor channels is beneficial to decreasing the intervals between adjacent semiconductor channels while ensuring the larger spacings between corresponding parts of the adjacent semiconductor channels. Therefore, more semiconductor channels can be provided in unit area, so as to improve the integration density of the semiconductor structure. Moreover, larger spacings between the opposite parts of the adjacent semiconductor channels are beneficial to weakening interferences between the adjacent semiconductor channels. In the subsequent combined structure of the first and second gate structures formed based on first L-shaped sidewalls of the semiconductor channels, larger spacings between opposite parts of the adjacent combined structures can be obtained, so as to weaken the interferences between the adjacent combined structures. Therefore, the electrical performance of the semiconductor structure is improved.

Each embodiment of the present disclosure will be described in detail below with reference to the drawings. However those skilled in the art will appreciate that in the each embodiment of the present disclosure, numerous technical details are presented for a better understanding of the present disclosure. However, even without these technical details and various variations and modifications based on the following embodiments, technical solutions claimed by the embodiments of the present disclosure may also be realized.

Figures 1, 2:
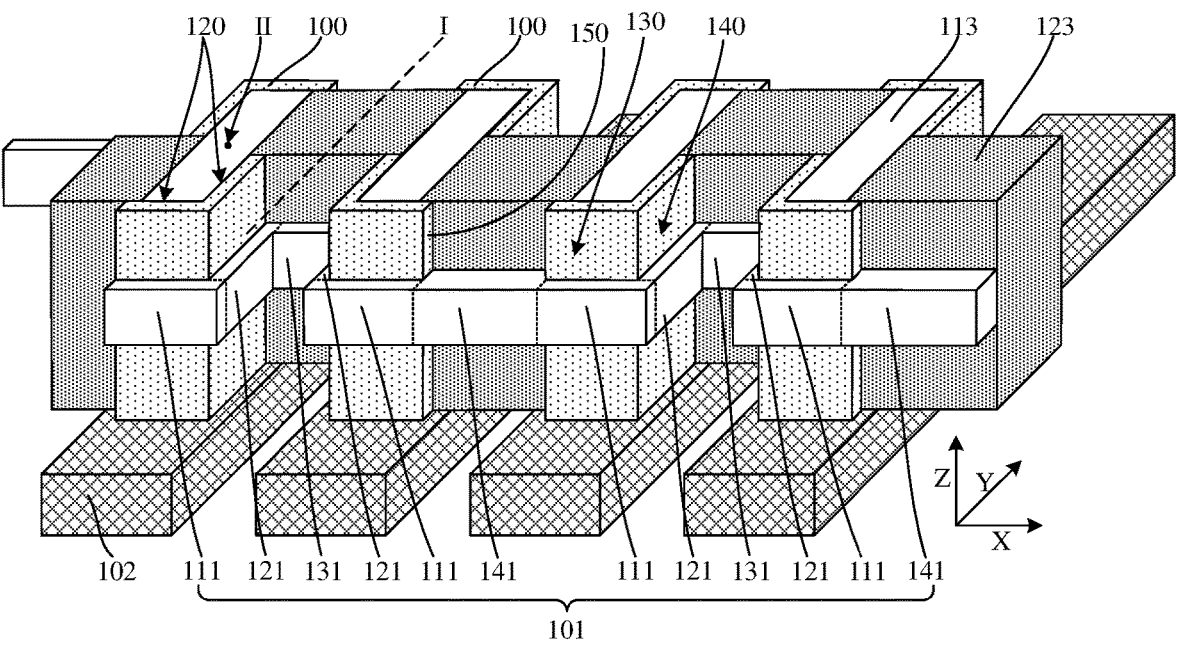
FIG. 1 is a partial schematic perspective view of a semiconductor structure of an embodiment of the present disclosure.
FIG. 2 is a partial schematic perspective view of semiconductor channels and gate structures in a semiconductor structure of an embodiment of the present disclosure.
Figure 8:
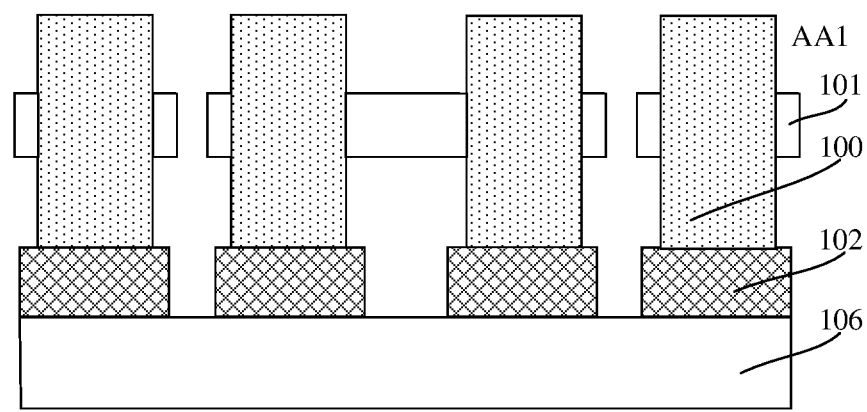
FIG. 8 is a schematic cross-sectional view of the structure shown in FIG. 3 along line AA1.
Figure 9:
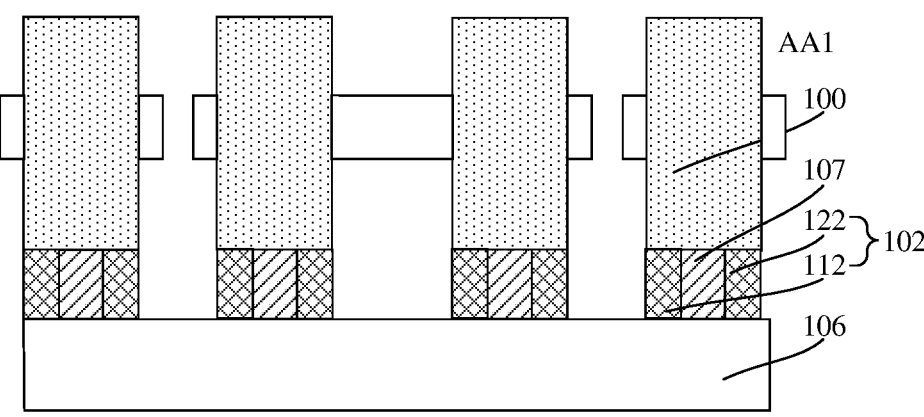
FIG. 9 is another schematic cross-sectional view of a semiconductor structure of an embodiment of the present disclosure along line AA1.
Figure 10:
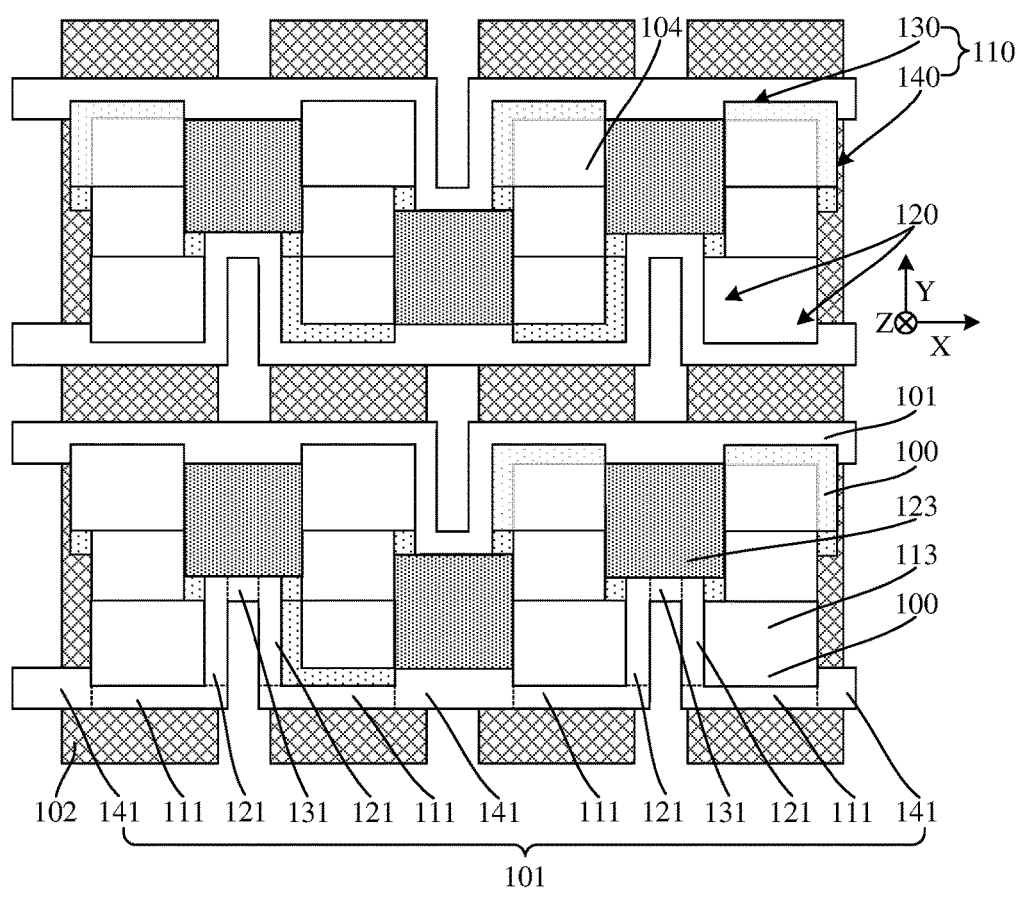
FIG. 10 is another partial schematic perspective view of a semiconductor structure of an embodiment of the present disclosure.

An embodiment of the present disclosure provides a semiconductor structure, which will be described in detail with reference to the drawings. FIG. 1 is a partial schematic perspective view of the semiconductor structure of an embodiment of the present disclosure. FIG. 2 is a partial schematic perspective view of semiconductor channels and gate structures in a semiconductor structure of an embodiment of the present disclosure. FIGS. 3 to 7 are five partial schematic top views of semiconductor structures of the embodiments of the present disclosure. FIG. 8 is a schematic cross-sectional view of the structure shown in FIG. 3 along the line AA1. FIG. 9 is another schematic cross-sectional view of a semiconductor structure of an embodiment of the present disclosure along line AA1. FIG. 10 is another partial schematic perspective view of a semiconductor structure of an embodiment of the present disclosure.

With Reference to FIGS. 1 to 10, the semiconductor structure includes semiconductor channels 100 extending in the third direction Z, first gate structures 111, second gate structures 121 and bit lines 102 extending in the second direction Y Each semiconductor channel 100 has an L-shaped cross-section in a plane perpendicular to the third direction Z, and includes a first L-shaped sidewall 110 and a second L-shaped sidewall 120 which are opposite to each other and extend in the third direction Z. The first L-shaped sidewall 110 includes a first face 130 extending in a first direction X and a second face 140 extending in a second direction Y Each first gate structure 111 is in contact with the first face 130. Each second gate structure 121 is in contact with the second face 140. The first gate structures 111 are in contact with the second gate structures 121. The combined structure of the first gate structure 111 and a second gate structure 121 has an L-shaped cross-section in a plane perpendicular to the third direction Z. Each bit line 102 is located on a side of each of the semiconductor channels 100 in the third direction Z. The first direction X, the second direction Y and the third direction Z intersect with each other.

It should be noted that the first gate structure 111 and the second gate structure 121 may be an integrally formed structure. Since the first gate structure 111 and the second gate structure 121 are in contact with each other, the first gate structure 111 and the second gate structure 121 shown in drawings are divided by a dashed line for clarity of drawings. When dividing the first gate structure 111 and the second gate structure 121, in some embodiments, with reference to FIGS. 1 to 4 and FIG. 7, a portion connecting the first gate structure 111 and the second gate structure 121 which correspond to a same semiconductor channel 100 has been put under the first gate structure 111. In other embodiments, with reference to FIGS. 5 and 6, the portion connecting the first gate structure 111 and the second gate structure 121 which correspond to a same semiconductor channel 100 has been put under the second gate structure 121. It can be understood that the portion connecting the first gate structure 111 and the second gate structure 121 which correspond to a same semiconductor channel 100 may be put under the first gate structure 111 or the second gate structure 121, the semiconductor structure of an embodiment of the present disclosure is not limited thereto.

Embodiments of the present disclosure will be described in more detail below with reference to the drawings.

With reference to FIGS. 1-5, in some embodiments, the semiconductor structure includes a plurality of the semiconductor channels 100 arranged at intervals in the first direction X, and adjacent semiconductor channels 100 are arranged axisymmetrically. The symmetry axis I is a symmetry axis between two adjacent semiconductor channels 100 in the first direction X. In this way, among the plurality of semiconductor channels 100 arranged in the first direction X, every two semiconductor channels 100 spaced apart by one semiconductor channel 100 therebetween are able to have a same arrangement orientation in the semiconductor structure. In addition, the first faces 130 of the semiconductor channels 100 arranged in the first direction X tend to be aligned with each other. Therefore, one gate structure 101 is common to multiple semiconductor channels 100 arranged in the first direction X. It can be understood that the gate structure 101 includes at least a plurality of the first gate structures 111 and a plurality of the second gate structures 121.

On a premise that the plurality of semiconductor channels 100 are arranged at intervals in the first direction X, and adjacent semiconductor channels 100 are arranged axisymmetrically, the gate structures 101 will be described in detail by two embodiments below.

Figure 3:
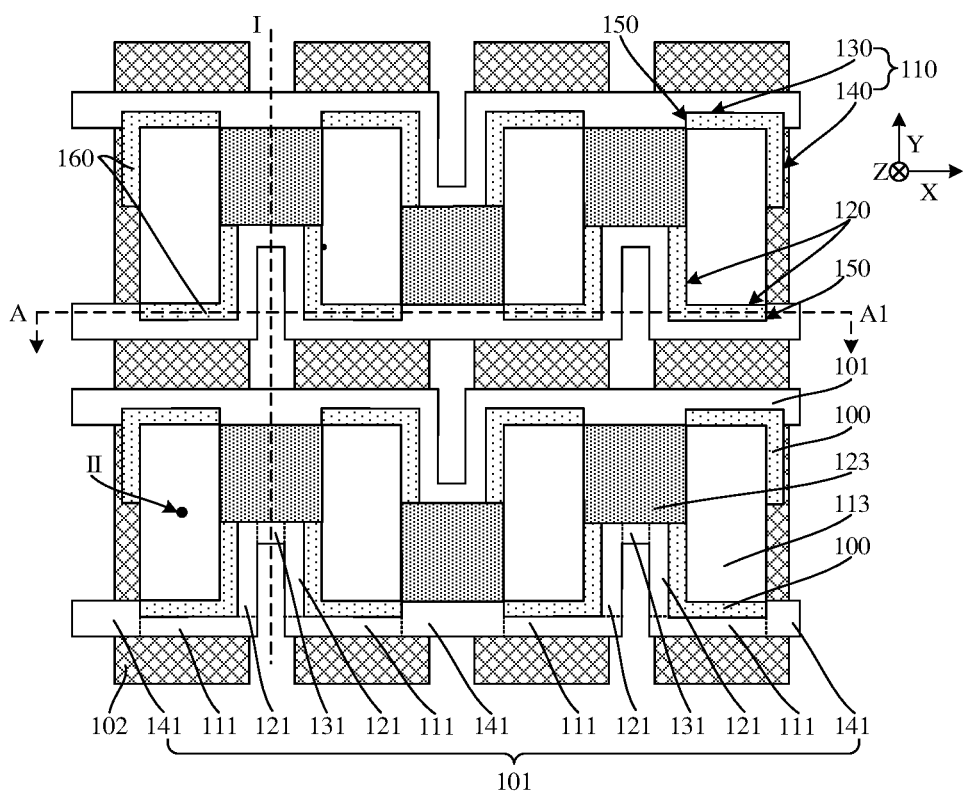
FIGS. 3 to 7 are five partial schematic top views of an semiconductor structure of an embodiment of the present disclosure.
Figure 4:
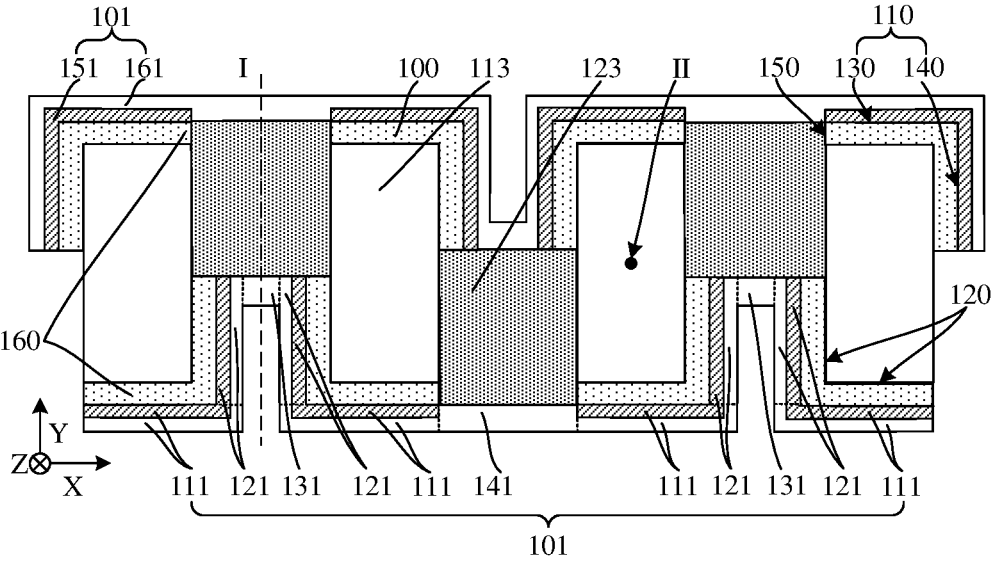

In some embodiments, with reference to FIGS. 1, 3, and 4, the semiconductor structure includes a plurality of the first gate structures 111 and a plurality of the second gate structures 121. Each of the first gate structures 111 and each of the second gate structures 121 are in a one-to-one correspondence with the semiconductor channels 100. That is, each first face 130 is in contact with a respective first gate structure 111, and each second face 140 is in contact with a respective second gate structure 121.

The semiconductor structure may further include third gate structures 131 and fourth gate structures 141. Each of the third gate structures is in contact with ends of two adjacent second gate structures 121 in the first direction X which are away from the first gate structure 111. Each of the fourth gate structures is in contact with ends of two adjacent first gate structures 111 in the first direction X which are away from the second gate structure 121. Each of the gate structures 101 is formed by at least one of the first gate structures 111, at least one of the second gate structures 121, at least one of the third gate structures 131 and at least one of the fourth gate structures 141.

It can be understood that each of the gate structures 101, as a whole, can form an elongated structure extending in the first direction X and having grooves. The first gate structures 111, the second gate structures 121, the third gate structures 131 and the fourth gate structures 141 can be integrally formed at the same time. For a single gate structure 101, every two adjacent second gate structures 121 and a third gate structure 131 form a U-shaped opening.

It should be noted that the connection relationships between the first gate structures 111 and the semiconductor channels 100 will be described in detail by two embodiments below.

Each of the semiconductor channels 100 further includes a third face 150 which is adjacent to the first face 130, and opposite to the second face 140. The third face 150 also extends in the third direction Z.

In an example, with reference to FIGS. 1 and 3, each of the fourth gate structure 141 is in contact with the respective first gate structures 111, and is also in contact with the respective third faces 150. In this way, the facing area between the gate structure 101 and each semiconductor channel 10 is increased, so as to improve a control capability of the gate structure 101 on the semiconductor channels 100.

In another example, with reference to FIG. 4, in a case that each of the fourth gate structures 141 is in contact with the respective first gate structures 111, each of the third faces 150 is in contact with a respective one of second isolation layers 123, which will be described in detail later.

It can be understood that the gate structure 101 may be or may not be in contact with the third faces 150 in the semiconductor structure, which can be flexibly adjusted according to an actual requirement.

Figure 5:
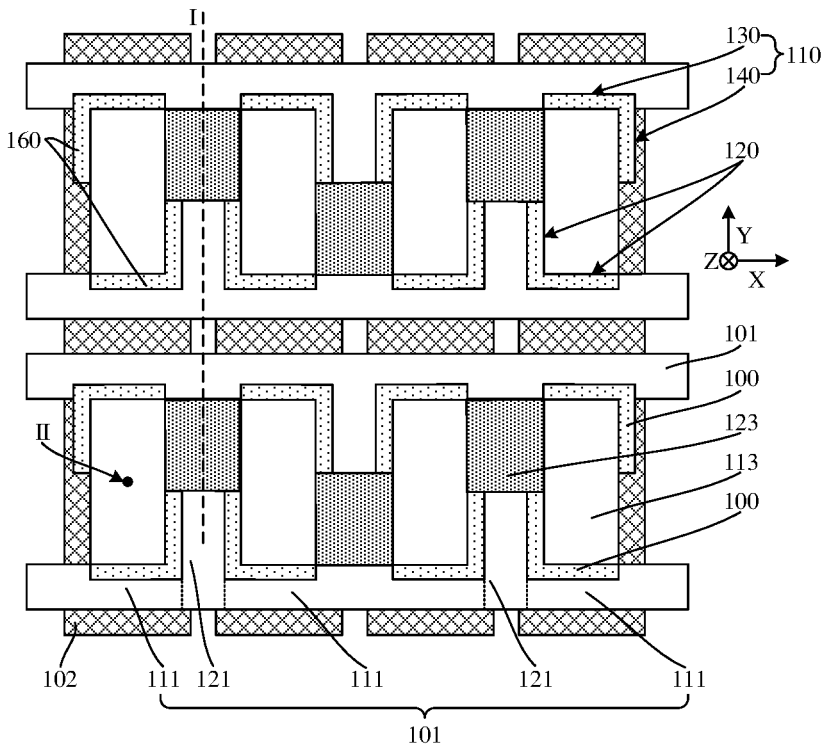

In some other embodiments, with reference to FIG. 5, for every three adjacent semiconductor channels 100 in the first direction X, a neighboring pair among the three adjacent semiconductor channels 100 is in contact with a same second gate structure 121, and another neighboring pair among the three adjacent semiconductor channels 100 is in contact with a same first gate structure 111. The first gate structures 111 and the second gate structures 121 are alternately arranged in the first direction X. Each of the gate structures 101 is formed by at least one of the first gate structures 111 and at least one of the second gate structures 121.

It can be understood that each second gate structure 121 is in contact with two adjacent second faces 140 in the first direction X, and each first gate structure 111 is in contact with two adjacent first faces 130 in the first direction X. In addition, each gate structure 101 may form an elongated structure extending in the first direction X and having protrusions. The first gate structures 111 and the second gate structures 121 may be formed in one piece. It should be noted that, in an example shown in FIG. 5, the first gate structure 111 is in contact with respective first faces 130, and in contact with respective third faces 150 and a respective one of the second isolation layers 123. In actual application, each of the first gate structures 111 can be only in contact with the first faces 130 and the second isolation layer 123, and each of the third faces 150 is in contact with and connect to the second isolation layers 123.

It should be noted that, in the example shown in FIG. 5, adjacent semiconductor channels 100 arranged at intervals in the first direction X are arranged axisymmetrically. Thus there may be only one second gate structure 121 or only one first gate structure 111 between every two adjacent second faces 140 in the first direction X. That is, there may be no first face 130 or there may be two first faces 130 located between the adjacent second faces 140 in the first direction X.

Figure 6:
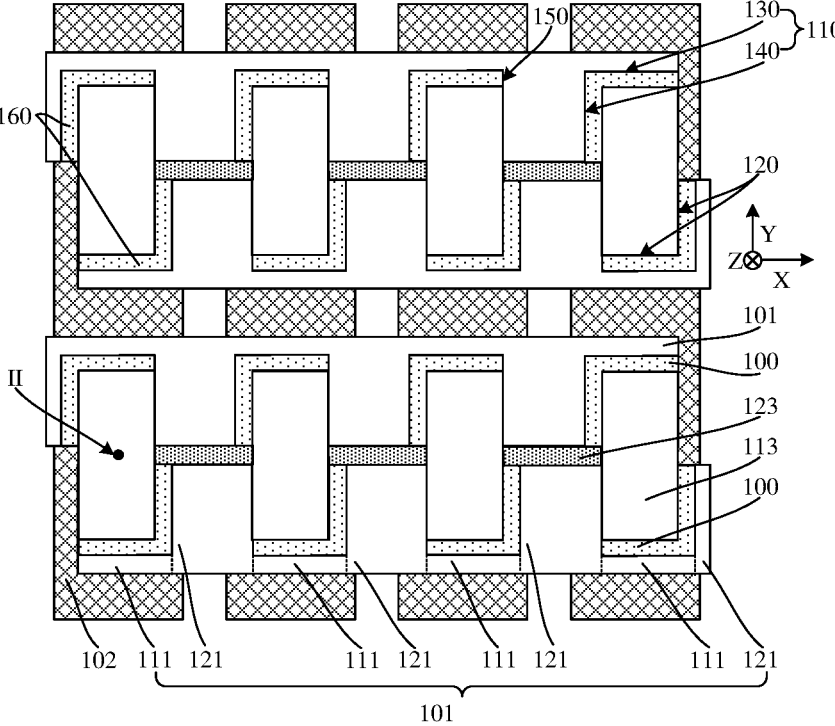
Figure 7:
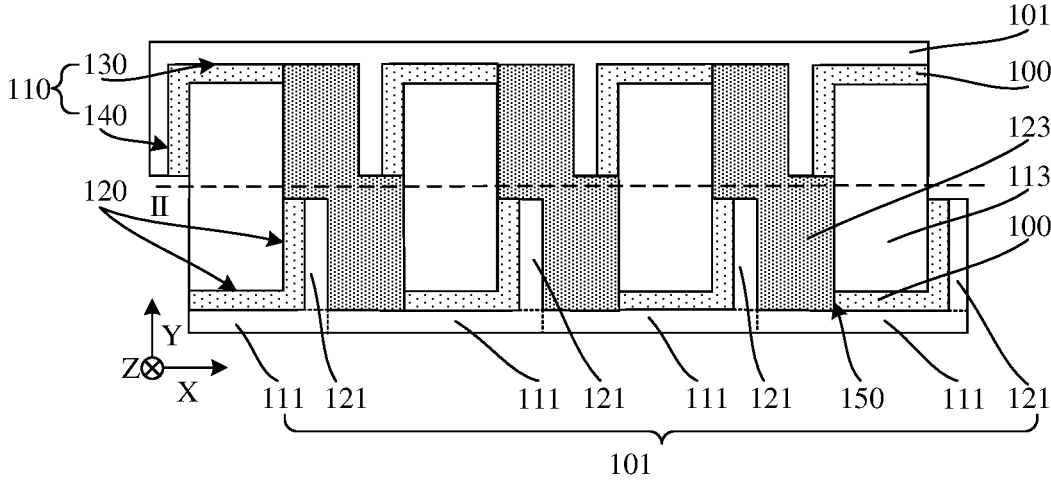

In some embodiments, with reference to FIGS. 6 and 7, a plurality of the semiconductor channels 100 are arranged at intervals in the first direction X. A first face 130 is provided between two adjacent second faces 140 in the first direction X. The of the first gate structures 111 and the second gate structures 121 are in a one-to-one correspondence with the semiconductor channels 100. Each of the second gate structures 121 is in contact with two adjacent first gate structures 111 in the first direction. Each of the gate structures is formed by at least one of the first gate structures 111 and at least one of the second gate structures 121.

It can be understood that, in examples shown in FIGS. 6 and 7, the semiconductor channels 100 arranged at intervals in the first direction X have a same arrangement orientation, such that the first faces 130 of the semiconductor channels 100 arranged in the first direction X tend to be aligned with each other. Therefore, one gate structure is common to the plurality of semiconductor channels 100 arranged in the first direction X.

On a premise that the plurality of semiconductor channels 100 are arranged at intervals in the first direction X, and adjacent semiconductor channels 100 are not arranged axisymmetrically, the gate structures 101 will be described in detail by two embodiments below.

In an example, with reference to FIG. 6, each of the second gate structures 121 is in contact with two adjacent first gate structures 111 in the first direction X, and also in contact with at least the third face 150. In this way, an area of the gate structure 101 directly facing the respective semiconductor channels 100 can be increased, so as to improve a control capability of the gate structures 101 on the semiconductor channels 100. It should be noted that in the example shown in FIG. 6, there is an interval space between the second face 140 of one of two adjacent semiconductor channels 100 and the third face 150 of the other of the two adjacent semiconductor channels 100, and the interval space is filled by the respective second gate structure 121. In actual disclosure, in the arranging manner of the semiconductor channels 100 shown in FIG. 6, and in a case of the gate structure 101 in contact with the first faces 130, the second faces 140 and the third faces 150, the gate structure 101 may further includes other gate structures in addition to the first gate structures 111 and the second gate structures 121. The specific configuration of the gate structure 101 is not limited.

In another example, with reference to FIG. 7, each of the first gate structures 111 is in contact with the first face 130, and also in contact with the second isolation layer 123. That is, a length of each of the first gate structures 111 in the first direction X is greater than a length of the semiconductor channel 100 corresponding to this first gate structure 111 in the first direction X. Furthermore, the second isolation layer 123 is in contact with the third face 150. It should be noted that, in the arranging manner of the semiconductor channels

100 shown in FIG. 7, in a case of the gate structure 101 in contact with the first faces 130 and the second faces 140, the gate structure 101 may further includes other gate structures in addition to the first gate structures 111 and the second gate structures 121. That is, the specific configuration of the gate structure 101 is not limited.

It should be noted that in the example shown in FIG. 1 and FIGS. 3 to 7, there are 4 semiconductor channels 100 arranged at intervals in the first direction X. In actual disclosure, the number of semiconductor channels 100 arranged at intervals in the first direction X is not limited, and for example, may be 2, 5, 8 etc.

In the above embodiments, with reference to FIG. 1 and FIGS. 3 to 7, the semiconductor structure includes a plurality of the semiconductor channels 100 arranged at intervals in the second direction Y Each of the semiconductor channels 100 arranged at intervals in the second direction Y is in a one-to-one correspondence with the gate structures 101. Spacings are provided between adjacent gate structures 101 in the second direction Y.

It can be understood that the L-shape of each of the semiconductor channels 100 is beneficial to increasing the integration density of the semiconductor channels 100 and increasing the intervals between the adjacent first gate structures 111 in the second direction Y, so as to mitigate the interferences between the adjacent gate structures 101.

In some embodiments, with reference to FIGS. 1 and 3-7, adjacent semiconductor channels 100 in the second direction Y are arranged centrosymmetrically. A symmetry point II is a symmetry point of two adjacent semiconductor channels 100 in the second direction Y.

It can be understood that, as the adjacent semiconductor channels 100 in the second direction Y are arranged centrosymmetrically, two second faces 140 of some of adjacent semiconductor channels 100 in the second direction Y are located between two respective first faces 130 due to the L-shapes of the semiconductor channels 100, such that two second gate structures 121 corresponding to two semiconductor channels 100 adjacent in the second direction Y are located between the two respective first faces 130. Thereby overall spaces occupied by adjacent semiconductor channels 100 in the second direction Y in the semiconductor structure are reduced, and an integration density of the semiconductor channels 100 is improved. In addition, with reference to FIGS. 1 and 3 to 5, semiconductor channels 100 adjacent in the first direction X are arranged axisymmetrically and semiconductor channels 100 adjacent in the second direction Y are arranged centrosymmetrically. Thus, the second gate structures 121 of one of two adjacent gate structures 101 in the second direction Y and second gate structures 121 of the other of two adjacent gate structures 101 in the second direction Y are staggered in the first direction X, so as to increase the spacing between two second gate structures 121 opposite in the second direction Y Therefore, the integration density of the semiconductor channels 100 in the semiconductor structure is improved. Intervals between the first gate structures 111 opposite in the second direction Y are decreased, and intervals between the second gate structures 121 opposite in the second direction Y are also decreased, so as to weaken interferences between adjacent gate structures 101 and improve the electrical performance of the semiconductor structure.

In actual disclosure, adjacent semiconductor channels 100 in the second direction Y can be arranged axisymmetrically. That is, the arrangements of the semiconductor channels 100 in the first direction X and in the second direction Y are not limited in the semiconductor structure of an embodiment of the present disclosure, as long as "a same gate structure 101 is common to a plurality of the semiconductor channels 100 are arranged at intervals in the first direction X, each of a plurality of the semiconductor channels 100 arranged at intervals in the second direction Y is in a one-to-one correspondence with the gate structures 101, and intervals are arranged between adjacent gate structure 101 in the second direction Y".

In above embodiments with reference to FIGS. 1, 3, 5 and 6, a single bit line 102 may be in contact with multiple semiconductor channels 100 arranged at intervals in the second direction Y.

It should be noted that in examples in FIGS. 1, 4, and 7, the number of the semiconductor channels 100 arranged at intervals in the second direction Y is 2. In FIGS. 3, 5, and 6, the number of the semiconductor channels 100 arranged at intervals in the second direction Y is 4. In actual disclosure, the number of semiconductor channels 100 arranged at intervals in the second direction Y is not limited, and may be 3, 6, 8, etc.

In above embodiments with reference to FIGS. 1 and 3 to 7, the adjacent semiconductor channels 100 in the second direction Y are arranged centrosymmetrically. Every two adjacent semiconductor channels 100 in the second direction Y define a reference structure 160. Two second faces 140 of the reference structure are located in the spacing between two first faces 130. The semiconductor structure may further includes: first isolation layers 113 in contact with two second L-shaped sidewalls 120 of in the reference structure 160, and second isolation layers 123 in contact with two second L-shaped sidewalls 120 of a respective one of the reference structures 160, each of the second isolation layers is located between adjacent first isolation layers 113 in the first direction X. The first isolation layers 113 are in contact with the second isolation layers 123, and the first isolation layers 113 and the second isolation layers 123 are alternately arranged in the first direction X (i.e. arranged one after another in the first direction X).

In the semiconductor structure, each of the first isolation layers 113 is configured to provide the insulation between two semiconductor channels 100 in contact with this first isolation layer. Each of the second isolation layers 123 is configured to provide the insulation between adjacent respective gate structures 101 in the second direction Y and respective semiconductor channels 100.

It can be understood that each of the first isolation layers 113 can be a rectangular prism with four corners. Each of the first isolation layers 113 may be in contact with two semiconductor channels 100. In the examples shown in FIGS. 1 to 7, every two semiconductor channels 100 corresponding to a same first isolation layer 113 are respectively located at two corners of the first isolation layer 113 which are furthest from each other, so as to increase an overall spacing between the two semiconductor channels 100. In actual disclosure, every two semiconductor channels 100 corresponding to a same first isolation layer 113 may be respectively located at any two corners of the first isolation layer 113.

The second isolation layers 123 in various embodiments will be described in detail below respectively.

In some embodiments, with reference to FIGS. 1, 3, 5, and 6, each of the second isolation layers 123 is located between adjacent first isolation layers 113 in the first direction X, and between two gate structures 101 corresponding to a reference structure 160. Each of the second isolation layers 123 is not in contact with or connected to the third face 150, and each of the gate structures 101 is in contact with the third faces 150.

In other embodiments, with reference to FIGS. 4 and 7, each of the second isolation layers 123 is located between adjacent first isolation layers 113 in the first direction X, and between two gate structures 101 corresponding to a reference structure 160. Each of the second isolation layers 123 is in contact with the third faces 150

It can be understood that arrangement of the second isolation layers 123 varies according to that of the gate structures 101, to provide insulation between the adjacent gate structures 101 in the second direction Y and the semiconductor channels 100.

In some embodiments, with reference to FIGS. 1, 3, and 5, a length of each of the first isolation layers 113 in the second direction Y is a first length. A length of each of the second isolation layers 123 in the second direction Y is a second length. A ratio of the second length to the first length ranges from ½ to ⅔. On the one hand, since the ratio of the second length to the first length is greater than or equal to ½, every two semiconductor channels 100 in contact with a same first isolation layer 113 do not have regions directly facing each other, thereby reducing the interference between said two semiconductor channels 100, such as the parasitic capacitance between them. On the other hand, since the ratio of the second length to the first length is less than or equal to ⅔, it is convenient to provide semiconductor channels 100 with a large size, thereby ensuring that gate structure 101 and the semiconductor channels 100 have sufficient areas directly facing each other.

In some embodiments, with reference to FIG. 4, each of the gate structures 101 includes a gate dielectric layer 151 and a gate 161. The gate dielectric layer 151 is disposed on the first face 130 and second face 140. The gate dielectric layer 151 is in a one-to-one correspondence with the semiconductor channels 100. The gate dielectric layer 151 has an L-shaped cross-section in a plane perpendicular to the third direction Z. The gate 161 is disposed on a side of the gate dielectric layer 151 away from each of the semiconductor channels 100. It can be understood that in an example shown in FIG. 4, only the first gate structures 111 and the second gate structures 121 include the gate dielectric layer 151. Each of the third gate structures 131 and the fourth gate structures 141 is formed only by the gate 161. That is, for a single gate structure 101, the gate structure may include a plurality of the gate dielectric layers 151 arranged axisymmetrically in the first direction and a gate 161 common to the plurality of gate dielectric layers 151.

It should be noted that the arrangement manner of the gate dielectric layer 151 and the gate 161 in the gate structures 101 shown in FIG. 4 is also applicable to the examples shown in FIGS. 1, 3, and 5 to 7. In addition, in actual disclosure, a same gate dielectric layer 151 may also be common to the plurality of semiconductor channels 100 arranged at intervals in the first direction X while ensuring that the gate dielectric layer 151 is located on the first face 130 and the second face 140.

The semiconductor structure further includes a substrate 106 located on the side of the bit lines 102 away from the semiconductor channels 100.

The bit lines 102 are described in detail below through following embodiments.

In some embodiments, with reference to FIG. 8, for a single bit line 102, the bit line 102 is a single layer structure. In addition, an orthographic projection of each semiconductor channel 100 on the substrate 106 is located in an orthographic projection of respective bit line 102 on the substrate 106. That is, an entire bottom surface of each semiconductor channel 100 facing the substrate 106 is in contact with the respective bit line 102, which facilitates increasing a contact area between the bit line 102 and the respective semiconductor channel 100. Therefore a contact resistance between the bit line 102 and the respective semiconductor channel 100 is reduced, so as to improve the electrical performance of the semiconductor structure. In an example, a material of the bit lines 102 can be a doped semiconductor material, such as a silicon material doped with N-type ions or P-type ions. Specifically, the N-type ions may be at least one of arsenic ions, phosphorus ions or antimony ions, and the P-type ions may be at least one of boron ions, indium ions, or gallium ions.

In other embodiments, with reference to FIG. 9, each of the bit lines 102 includes a first sub-bit line 112 and a second sub-bit line 122 which are spaced from each other in the first direction X, the first sub-bit line 112 and the second sub-bit line 122 extend in the second direction Y The semiconductor structure further includes insulation layers 107 each located between the first sub-bit line 112 and the second sub-bit line 122. In an example, materials of the bit lines 102 includes at least one of metallic materials such as tungsten, aluminum, titanium, or tantalum, or at least one of conductive materials such as titanium nitride, tantalum nitride, or tungsten nitride.

In some embodiments, a material of the semiconductor channels 100 includes silicon or silicon germanium. In an example, the material of the semiconductor channels 100 is silicon germanium, which facilitates improving the carrier mobility of the channel regions in the semiconductor channels 100 through silicon germanium, so as to increase an on/off ratio of a transistor formed by the gate structures 101 and the semiconductor channels 100. Therefore, the electrical performance of the semiconductor structure can be improved. The channel region in the semiconductor channel 100 refers to the semiconductor channels 100 in contact with the gate structure 101.

In some embodiments, with reference to FIG. 10, the semiconductor structure may further include capacitive structures 104, each of which at least in contact with a side of the respective semiconductor channel 100 away from the respective bit line 102. It can be understood that each of the capacitive structures 104 is in a one-to-one correspondence with the semiconductor channels 100. In examples shown in FIGS. 1 to 7, the integration density of the semiconductor channels 100 in the semiconductor structure is improved. Therefore the integration density of the capacitive structures 104 in the semiconductor structure is also improved.

It should be noted that FIG. 10 shows the capacitor structures 104 added on the basis of the semiconductor structure of FIG. 1. It can be understood that in the examples shown in FIGS. 1 to 7, in case that adjacent capacitive structures 104 are arranged at intervals. The disclosure is not limited to the specific arrangement of the capacitive structures 104, as long as a contact area between the capacitive structure 104 and the side of the respective semiconductor channel 100 away from the substrate 106 is increased as much as possible.

To sum up, the semiconductor channel 100 has an L-shaped cross-section in the plane perpendicular to the third direction Y In this way, in case that a plurality of semiconductor channels 100 are arranged, the L-shaped cross-section of each of the semiconductor channels 100 is beneficial to decreasing intervals between whole adjacent semiconductor channels 100 while ensuring a larger spacing between opposite parts of the adjacent semiconductor channels 100. Therefore, a larger number of semiconductor channels 100 can be provided in per unit area, so as to improve the integration density of the semiconductor structure. Moreover, larger spacing between the opposite parts of the adjacent semiconductor channels 100 is beneficial to weakening the interference between the adjacent semiconductor channels 100. In the combined structures of the first gate structures 111 and the second gate structures 121 formed based on the first L-shaped sidewalls 110 of the semiconductor channels 100, larger spacing between opposite parts of the adjacent combined structures can be obtained, so as to weaken interferences between the adjacent combined structures. Therefore, the electrical performance of the semiconductor structure is improved.

Another embodiment of the present disclosure further provides a manufacturing method of a semiconductor structure, which is used for manufacturing the semiconductor structure of the above embodiments. The manufacturing method of the semiconductor structure of another embodiment of the present disclosure will be described in detail below with reference to FIGS. 1 to 20. FIGS. 11 to 20 are partial schematic views, each of which corresponds to a respective operation of the manufacturing method of the semiconductor structure of the embodiment of the present disclosure.

Figure 18:
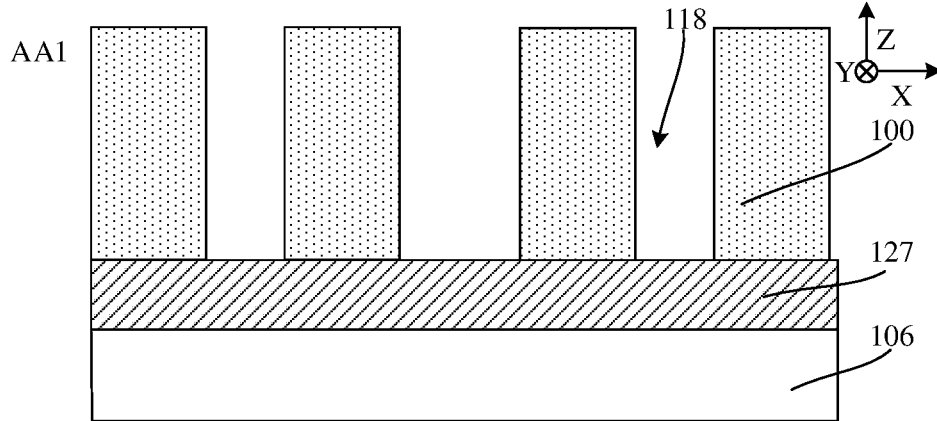
Figure 19:
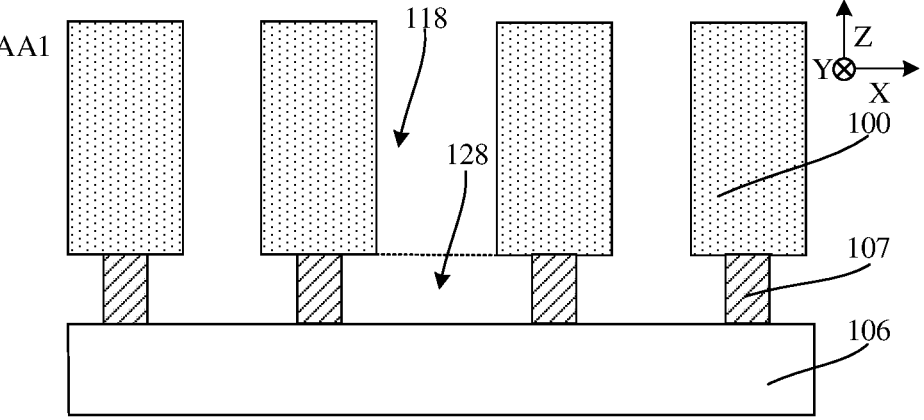

It should be noted that identical or corresponding parts with above embodiments will not be repeated here. FIGS. 11 to 17 and FIG. 20 are schematic perspective views, each of which corresponds to the respective operation of the manufacturing method of the semiconductor structure. FIG. 18 is a schematic cross-sectional view of FIG. 17 along line AA1. FIG. 19 is a schematic cross-sectional view corresponding to an operation in the manufacturing method of the semiconductor structure of the embodiment of the present disclosure.

With reference to FIG. 1 to FIG. 20, the manufacturing method of the semiconductor structure includes an operation of forming semiconductor channels 100 extending in a third direction Z. Each semiconductor channel 100 has an L-shaped cross-section in a plane perpendicular to the third direction Z, and includes a first L-shaped sidewall 110 and a second L-shaped sidewall 120 which are opposite to each other and extend in the third direction Z. The first L-shaped sidewall 110 includes a first face 130 extending in a first direction X and a second face 140 extending in a second direction Y The method also includes an operation of forming first gate structures 111 and second gate structures 121 which are in contact with each other. Each first gate structure 111 is in contact with the first face 130, each second gate structure 121 is in contact with the second face 140. A combined structure formed by the first gate structure 111 and the second gate structure 121 has an L-shaped cross-section in the plane perpendicular to the third direction Z. The method also includes an operation of forming bit lines 102 extending in the second direction Y and located on a side of the semiconductor channel 100 in the third direction Z. The first direction X, the second direction Y and the third direction Z intersect with each other.

It should be noted that the first gate structure 111 and the second gate structure 121 are formed after the formation of the semiconductor channel 100. In another embodiment of the present disclosure, a sequence of the formation of the semiconductor channel 100 and the formation of the bit line 102 is not limited and can be adjusted according to the actual requirement. The manufacturing method of the embodiment of the present disclosure includes but is not limited to specific examples of the manufacturing method for the semiconductor structure in the following description.

Figure 11:
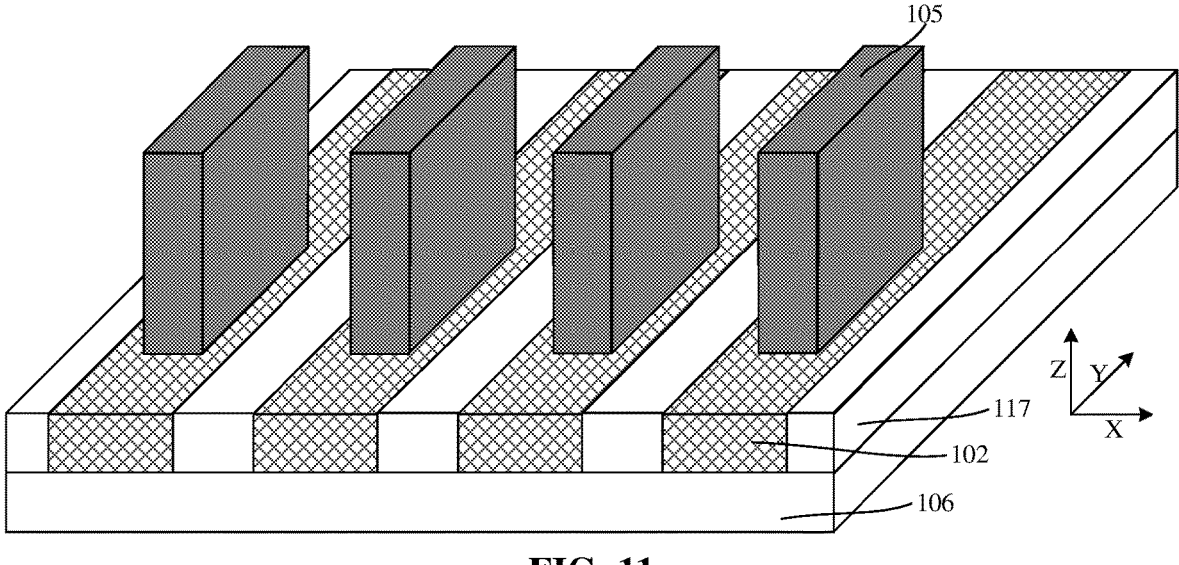
FIGS. 11 to 20 are partial schematic views, each of which corresponds to a respective operation of the method for manufacturing the semiconductor structure of the present disclosure.
Figure 12:
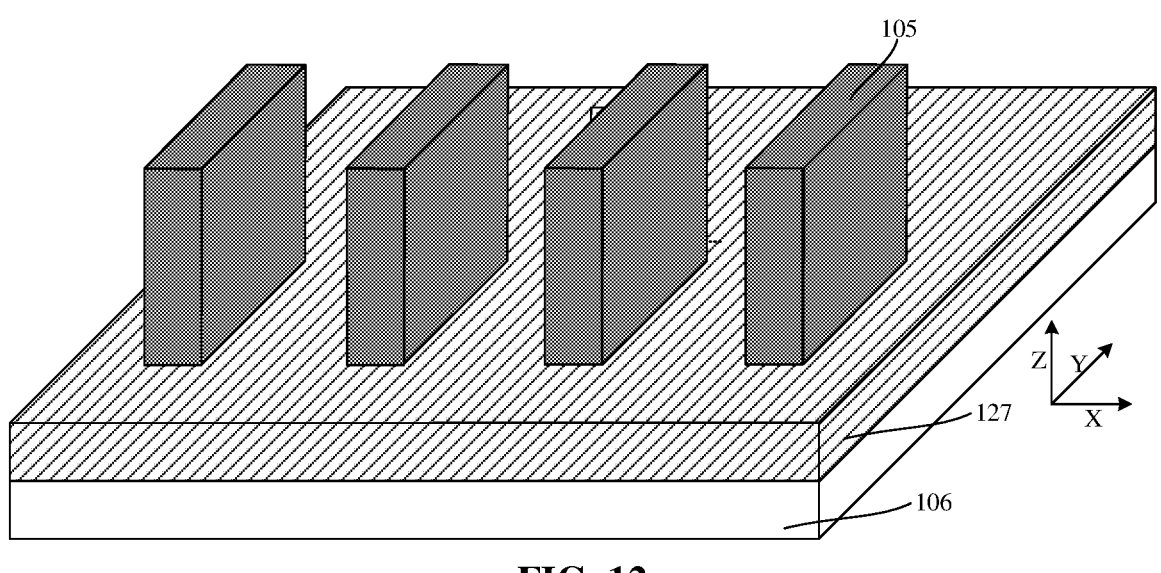

In some embodiments, with reference to FIG. 11 or FIG. 12, the operation of forming the semiconductor channels 100 may include: forming semiconductor columns 105 arranged at intervals in the first direction X and/or the second direction Y A material of the semiconductor columns 105 may be a semiconductor material such as silicon or silicon germanium.

It can be understood that by means of the semiconductor columns 105, the semiconductor channels 100 each located on a part of the sidewall of the respective semiconductor column 105 extending in the third direction Z will be subsequently formed. Therefore, an arrangement manner of the semiconductor columns 105 generally determines an arrangement manner of the semiconductor channels 100. For example, if the semiconductor columns 105 are arranged at intervals in the first direction X, the semiconductor channels 100 are also arranged at intervals in the first direction X; if the semiconductor columns 105 are arranged at intervals in the second direction Y, the semiconductor channels 100 are also arranged at intervals in the second direction Y.

It should be noted that in an example of FIGS. 11 and 12, four semiconductor columns 105 are arranged at intervals in the first direction X. In actual disclosure, the number of semiconductor columns 105 arranged at intervals in the first direction X is not limited. Furthermore, a plurality of the semiconductor columns 105 may also be arranged at intervals in the second direction Y, or a plurality of the semiconductor columns 105 may be arranged at intervals in the first direction X and arranged at intervals in the second direction Y In addition, the present disclosure is not limited to a specific process for forming the plurality of semiconductor columns 105.

A sequence of the formation of the semiconductor columns 105 and the formation of the bit lines 102 will be described in detail below through following embodiments.

In some embodiments with reference to FIG. 11, the bit lines 102 are formed prior to the formation of the semiconductor channels 100 and the gate structures 101, i.e. prior to the formation of the semiconductor columns 105. The operation of forming the bit lines 102 may include: providing a substrate 106; and forming, bit lines 102 extending in the second direction Y and arranged at intervals in the first direction X, on the substrate 106.

It will be understood that, in some embodiments, the substrate 106, the bit lines 102 and the semiconductor columns 105 have same semiconductor chemical elements. Therefore, the substrate 106, the bit lines 102 and the semiconductor columns 105 may be formed by a same film structure composed of the semiconductor chemical elements. Thereby a process for forming the bit lines 102 is simplified. In addition, a material of the bit lines 102 may be doped semiconductor material, such as silicon material doped with N-type ions or P-type ions.

Figure 14:
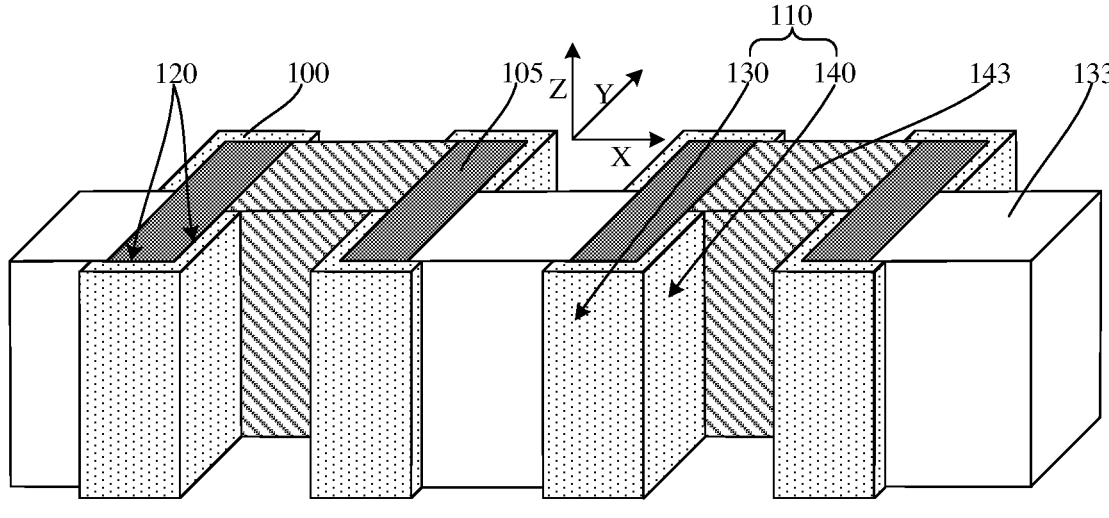

With reference to FIGS. 11 and 14, the operation of forming the semiconductor channels 100 may include: forming the semiconductor channels 100 on a side of the bit lines 102 away from the substrate 106, with a bottom surface of each semiconductor channel 100 facing the substrate 106 being in contact with the respective bit line 102.

With reference to FIG. 11, after the bit lines 102 are formed and before the semiconductor columns 105 are formed, the manufacturing method further includes: forming first dielectric layers 117 each located between adjacent bit lines 102 to provide the insulation between adjacent bit lines 102.

In other embodiments, with reference to FIG. 12, before the semiconductor columns 105 are formed, the manufacturing method may further include: providing a substrate 106; forming an initial insulation layer 127 on the substrate 106. In a subsequent operation, the initial insulation layer 127 will be etched to provide spaces for forming the bit lines 102. Continue with reference to FIG. 12, the operation of forming the semiconductor columns 105 may include: forming the semiconductor columns 105 on a side of the initial insulation layer 127 away from the substrate 106.

With reference to FIGS. 11 to 14, the semiconductor channels 100 are formed on sidewalls of the semiconductor columns 105 extending in the third direction Z. Every two semiconductor channels 100 in contact with a same semiconductor column 105 are arranged centrosymmetrically, and/or adjacent semiconductor channels 100 in the first direction X are arranged axisymmetrically.

It can be understood that each of the semiconductor columns 105 may be a rectangular prism with four corners. Each of the semiconductor columns 105 may be in contact with two respective semiconductor channels 100. Furthermore, in an example shown in FIG. 4, the two semiconductor channels 100 corresponding to a same semiconductor column 105 are respectively located at two corners of the semiconductor column 105 which are furthest from each other, so as to increase an overall spacing between the two semiconductor channels 100. In actual disclosure, the two semiconductor channels 100 corresponding to a same semiconductor column 105 may be respectively located at any two corners of the semiconductor column 105.

Figure 13:
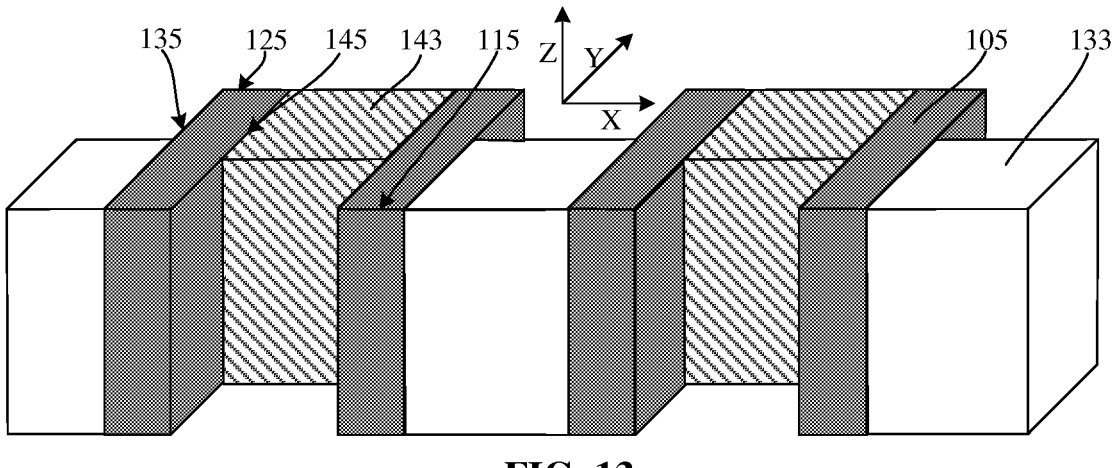

The operation of forming semiconductor channels includes, but is not limited to, the following embodiments:

In some embodiments, with reference to FIG. 13, each of the semiconductor columns 105 has a first side 115 and a second side 125 opposite to each other in the second direction Y A length of each semiconductor column 105 in the second direction Y is a third length. After the semiconductor columns 105 are formed and before the semiconductor channels 100 are formed, the manufacturing method may further include the operations described below.

Continue with reference to FIG. 13, the operation of forming third isolation layers 133 and fourth isolation layers 143 is shown. The third isolation layers 133 and the fourth isolation layers 143 are alternately located between adjacent semiconductor columns 105 in the first direction X. One of sidewalls of each third isolation layers 133 which extends in the third direction Z is flush with the first side 115. A length of each of the third isolation layers 133 in the second direction Y is less than the third length. One of sidewalls of each fourth isolation layers 143 which extends in the third direction Z is flush with the second side 125. A length of each of the fourth isolation layers 143 in the second direction Y is less than the third length.

In some embodiments, each of two opposite end surfaces of each third isolation layer 133 in the third direction Z is flush with a respective one of two opposite end surfaces of each semiconductor column 105 in the third direction Z, respectively. Each of two opposite end surfaces of each fourth isolation layer 143 in the third direction Z is flush with a respective one of two opposite end surfaces of each semiconductor column 105 in the third direction Z, respectively. It can be understood that, in the third direction Z, top surfaces of the third isolation layers 133, top surfaces of the fourth isolation layers 143 and top surfaces of the semiconductor columns 105 are flush with each other, and bottom surfaces of the third isolation layers 133, bottom surfaces of the fourth isolations layer 143 and bottom surfaces of the semiconductor columns 105 are flush with each other.

Each of the semiconductor columns 105 has a third side 135 and a fourth side 145 opposite to each other in the first direction X. The third side 135 may be divided into a first region and a second region in the second direction Y. The fourth side 145 may be divided into a third region and a fourth region in the second direction Y. Each of the third isolation layers 133 may completely cover the first region(s) of the respective semiconductor column(s), and each of the fourth isolation layers 143 may completely cover the fourth region(s) of the respective semiconductor column(s).

With reference to FIGS. 13 and 14, each of the semiconductor channels 100 are formed on parts of sidewalls of the respective semiconductor column 105 extending in the third direction Z which are exposed form the third isolation layer 133 and the fourth isolation layer 143. It can be understood that a third L-shaped sidewall may be formed by the first side 115 and the exposed third region, and a fourth L-shaped sidewall may be formed by the second side 125 and the exposed second region. One semiconductor channel 100 can be formed based on the third L-shaped sidewall, and another semiconductor channel 100 can be formed based on the fourth L-shaped sidewall. The third isolation layers 133 and the fourth isolation layers 143 serve to isolate every two semiconductor channels 100 from one another. Each of the second L-shaped sidewalls 120 of the semiconductor channels 100 is in contact with the third L-shaped sidewall or the fourth L-shaped sidewall.

In an example, by means of an epitaxial growth process, each of the semiconductor channels 100 may be formed on the exposed parts of the sidewalls of the respective semiconductor column 105 extending in the third direction Z.

In some embodiments, a length of each of the semiconductor columns 105 in the second direction Y is a third length. A ratio of the length of each of the third isolation layers 133 in the second direction Y to the third length ranges from $1/2$ to $2/3$, and/or a ratio of the length of each of the fourth isolation layers 143 in the second direction Y to the third length ranges from $1/2$ to $2/3$.

It can be understood that the semiconductor channels 100 are formed based on parts of the sidewalls of the semiconductor columns 105 which are not covered by the third isolation layers 133 and fourth isolation layers 143. Therefore, a size of the semiconductor channel 100 is affected by a size of the third isolation layer 133 and a size of the fourth isolation layer 143.

In actual disclosure, due to limitations of the manufacturing process or actual requirements, the length of the third isolation layer 133 in the second direction Y may be not equal to the length of the fourth isolation layer 143 in the second direction Y, that is, the sizes of two semiconductor channels 100 corresponding to a same semiconductor column 105 may not be identical. In other embodiments, the length of the third isolation layer 133 in the second direction Y may be equal to the length of the fourth isolation layer 143 in the second direction Y.

For the third isolation layers 133 or the fourth isolation layers 143, on the one hand, the ratio of the length of the third isolation layer 133 or the fourth isolation layer 143 in the second direction Y to the third length is greater than or equal to $1/2$, so as to avoid that two semiconductor channels 100 in contact with adjacent third isolation layer 133 and fourth isolation layer 143 have regions directly facing each other, thereby reducing the interference between said two semiconductor channels 100, such as parasitic capacitance between them. On the other hand, the ratio of the length of the third isolation layer 133 or the fourth isolation layer 143 in the second direction Y to the third length is less than or equal to $2/3$, such that each semiconductor channel 100 has a large size, thereby ensuring that the gate structure 101 and the semiconductor channel 100 have sufficient areas directly facing each other.

It should be noted that the manufacturing method of the embodiment of the present disclosure does not limit a specific process for forming the third isolation layers 133 and the fourth isolation layers 143. For example, an initial isolation layer which covers all sidewalls of the semiconductor columns 105 extending in the third direction Z is formed first, and the initial isolation layer is etched to form the third isolation layers 133 and the fourth isolation layers 143. In addition, spaces occupied by the third isolation layers 133 and fourth isolation layers 143 will be used for forming the first isolation layers 113 (with reference to FIG. 1). A material of the third isolation layers 133 may be the same as or different from a material of the fourth isolation layers 143. For example, the material of the third isolation layers 133 and the material of the fourth isolation layer 143 may both be silicon oxide.

In other embodiments, the operation of forming the semiconductor channels 100 may include: forming an initial semiconductor channel (not shown) on four sidewalls of the semiconductor column 105 extending in the third direction Z, then etching the initial semiconductor channel by means of a mask to form the final semiconductor channel. A process for forming the initial semiconductor channel may also use the epitaxial growth process.

In some embodiments, according to above description and with reference to FIG. 12, before the semiconductor columns 105 are formed, the manufacturing method may further include: providing the substrate 106; and forming an initial insulation layer 127 on the substrate 106. The operation of forming the semiconductor columns 105 includes: forming the semiconductor columns 105 on a side of the initial insulation layer 127 away from the substrate 106. After the semiconductor channels 100 are formed, the formation of the bit lines 102 includes the following.

Figure 15:
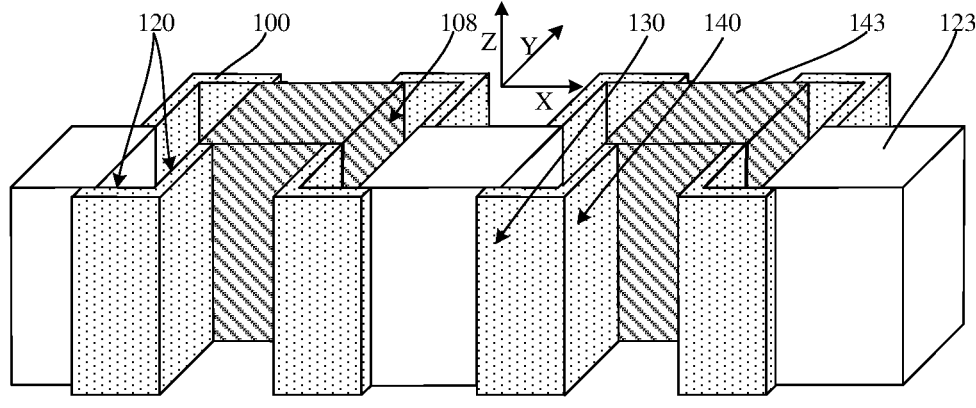

With reference to FIG. 15, the semiconductor columns 105 are removed to form first grooves 108.

Figure 17:
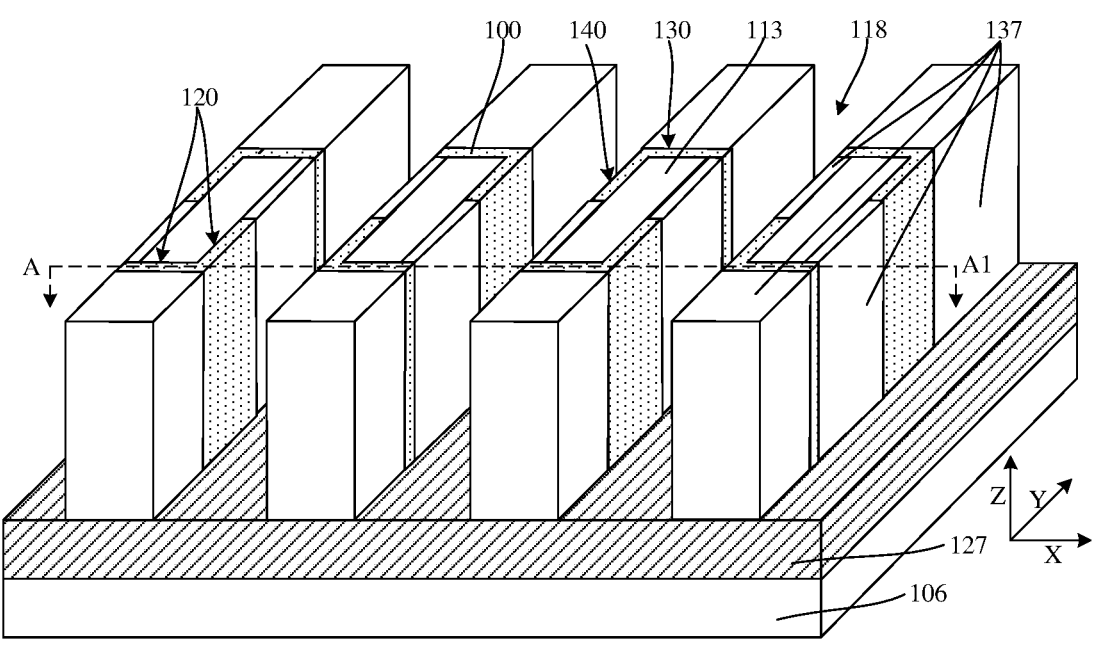

With reference to FIGS. 15 and 17, the first isolation layers 113 filled into the first groove 108 are formed.

With reference to FIGS. 15 and 17, the third isolation layers 133 and the fourth isolation layers 143 are removed.

With reference to FIGS. 17 and 18, second dielectric layers 137 are formed, with gaps 118 being provided between the adjacent semiconductor channels 100 in the first direction X.

With reference to FIGS. 18 and 19, the initial insulation layer 127 is etched through the gaps 118 to form second grooves 128. At least a part of the bottom surface of each semiconductor channel 100 facing the substrate 106 is exposed through the second grooves 128. An orthographic projection of each gap 118 on the substrate 106 is located in an orthographic projection of the respective second groove 128 on the substrate 106. Remaining part of the initial insulation layer forms the insulation layers 107.

With reference to FIGS. 19 and 9, the bit lines 102 are formed in the second grooves 128. Each of the bit lines 102 is in contact with at least part of the bottom surfaces of the respective semiconductor channels 100 facing the substrate 106 and exposed through the second groove 128. Each of the bit lines 102 includes a first sub-bit line 112 and a second sub-bit line 122 which are located respectively on two opposite sides of the insulation layer 107 in the first direction X. The first sub-bit lines 112 and the second sub-bit lines 122 extend in the second direction Y.

Figure 20:
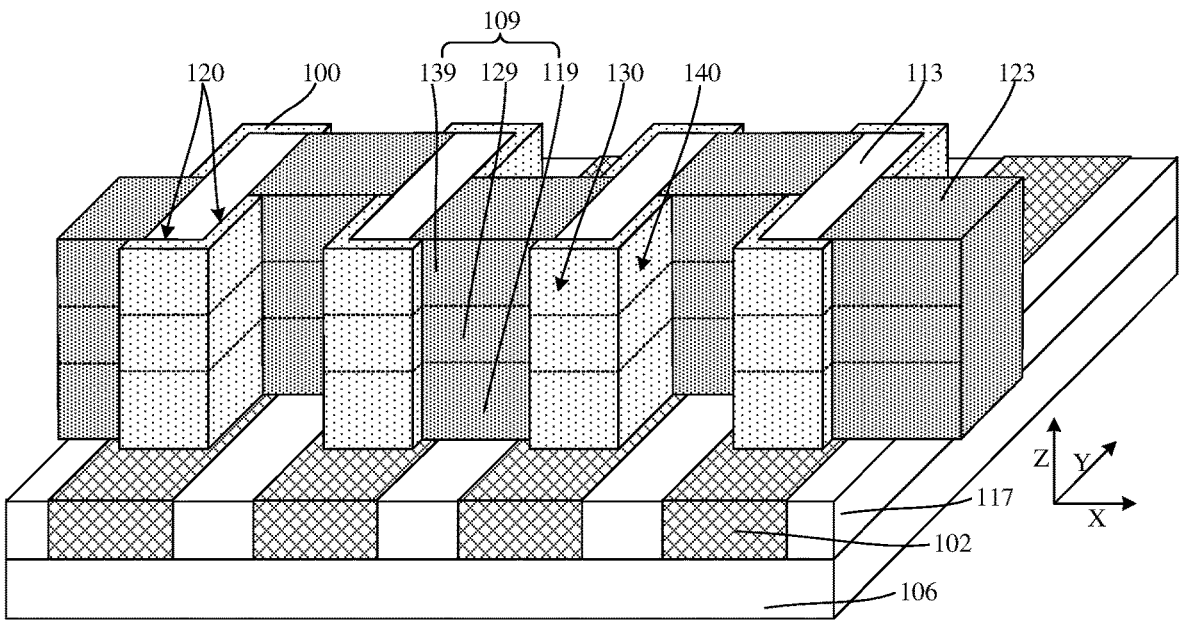

In above embodiments, with reference to FIG. 20, after the third isolation layers 133 (with reference to FIG. 13) and the fourth isolation layers 143 (with reference to FIG. 13) are removed, the second isolation layers 123 are formed in spaces previously occupied by the third isolation layers 133 and the fourth isolation layers 143. It should be noted that the manufacturing method of the embodiment of the present disclosure does not limit the specific process for forming the first isolation layers 113.

In some embodiments, with reference to FIG. 20, after the semiconductor channels 100 are formed, the operation of forming the first gate structures 111 and the second gate structures 121 may include: forming the second isolation layers 123. The second isolation layers 123 cover parts of the sidewalls of the first isolation layers 113 extending in the third direction Z and exposed form the semiconductor channels 100. Each of the second isolation layers 123 is connected to adjacent first isolation layers in the first direction. It can be understood that the second isolation layers 123 are formed after the third isolation layers 133 (with reference to FIG. 13) and the fourth isolation layers 143 (with reference to FIG. 13) are removed, that is, the second isolation layers 123 are formed in the spaces previously occupied by the third isolation layers 133 and the fourth isolation layers 143. It should be noted that the manufacturing method of the embodiment of the present disclosure does not limit the specific process for forming the second isolation layers 123.

With reference to FIGS. 20 and 1, the sidewalls of semiconductor channels 100 and the sidewalls of the second isolation layers 123 which extend in the third direction Z together form a reference sidewall 109. The reference sidewall 109 includes a first region 119, a second region 129 and a third region 139 arranged successively in the third direction Z. The gate structure 101 is formed in the second region 129. The gate structure 101 is in contact with a plurality of the semiconductor channels 100 arranged at intervals in the first direction X. The gate structure 101 includes at least the first gate structures 111 and the second gate structures 121.

Figure 16:
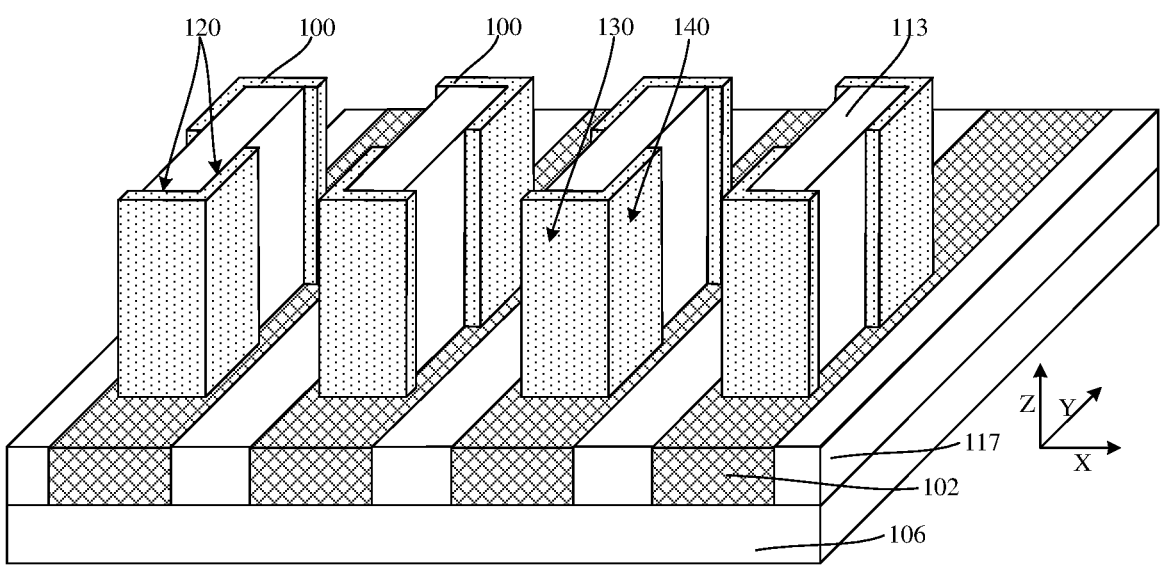

It should be noted that the specific configuration of the gate structure 101 may be referred to the embodiment of the present disclosure and will not be described here. Furthermore, FIGS. 13 to 15 do not show structures such as the substrate and the bit lines etc., and the operations shown in FIGS. 13 to 15 are applicable to two cases respectively shown in FIGS. 11 and 12. FIGS. 16 and 20 merely take the substrate 106 and the bit lines 102 shown in FIG. 11 as examples. In actual disclosure, the operations of forming the first isolation layers 113 and the second isolation layers 123 shown in FIGS. 16 and 20 are also applicable to the case shown in FIG. 12. That is, the process operations of the manufacturing method shown in FIGS. 13 to 16 and FIG. 20 are applicable to both cases respectively shown in FIGS. 11 and 12. Moreover, the manufacturing method of the embodiment of the present disclosure does not limit the specific process for forming the gate structures 101.

In conclusion, in the semiconductor structure produced by the manufacturing method of an embodiment of the present disclosure, each semiconductor channel 100 have the L-shaped cross-section in the plane perpendicular to the third direction Y In this way, in case that a plurality of semiconductor channels 100 are provided, the L-shaped cross-section of each of the semiconductor channels 100 is beneficial to decreasing the overall intervals between adjacent semiconductor channels 100 while ensuring larger spacings between opposite parts of the adjacent semiconductor channels 100. Therefore, a larger number of semiconductor channels 100 can be provided in per unit area, so as to improve the integration density of the semiconductor structure. Moreover, larger spacing between the opposite parts of the adjacent semiconductor channels 100 is beneficial to weakening the interference between the adjacent semiconductor channels 100. In the combined structure of the first gate structures 111 and the second gate structures 121 formed based on the first L-shaped sidewalls 110 of the semiconductor channels 100, larger spacings between opposite parts of the adjacent combined structures can be obtained, so as to weaken the interference between the adjacent combined structures. Therefore, the electrical performance of the semiconductor structure is improved.

Those skilled in the art may understand that the above embodiments are specific embodiments for implementing the present application, and in practical applications, various changes may be made thereto in form and detail without departing from the spirit and scope of the present application. Those skilled in the art can make various changes and modifications without departing from the spirit and scope of the embodiments of the present disclosed. Therefore the protection scope of the embodiments of the present disclosed should be defined by the claims.

The invention claimed is:

1. A semiconductor structure, comprising:
semiconductor channels extending in a third direction, each of the semiconductor channels has an L-shaped cross-section in a plane perpendicular to the third direction, each of the semiconductor channels comprises a first L-shaped sidewall and a second L-shaped sidewall which are opposite to each other and extend in the third direction, the first L-shaped sidewall comprises a first face extending in a first direction and a second face extending in a second direction;
first gate structures, each of the first gate structures is in contact with the first face;
second gate structures, each of the second gate structures is in contact with the second face, each of the first gate structures is in contact with a respective one of the second gate structures, and forms a combined structure together with the respective one of the second gate structures, the combined structure has an L-shaped cross-section in the plane perpendicular to the third direction; and
bit lines extending in the second direction and located on a side of each of the semiconductor channels in the third direction;
wherein the first direction, the second direction and the third direction intersect with each other.

2. The semiconductor structure according to claim 1, wherein the semiconductor channels are arranged at intervals in the first direction, and adjacent semiconductor channels are arranged axisymmetrically.

3. The semiconductor structure according to claim 2, wherein each of the first gate structures and each of the second gate structures are in a one-to-one correspondence with the semiconductor channels; the semiconductor structure further comprises:
third gate structures, each of the third gate structures is in contact with ends of two adjacent second gate structures in the first direction, which are away from the respective first gate structure; and
fourth gate structures, each of the fourth gate structures is in contact with ends of two adjacent first gate structures in the first direction, which are away from the respective second gate structure;
wherein each of gate structures is formed by at least one of the first gate structures, at least one of the second gate structures, at least one of the third gate structures and at least one of the fourth gate structures.

4. The semiconductor structure according to claim 2, wherein for every three adjacent semiconductor channels in the first direction, a neighboring pair among the three adjacent semiconductor channels is in contact with a same second gate structure, and another neighboring pair among the three adjacent semiconductor channels is in contact with a same first gate structure, the first gate structures and the second gate structures are alternately arranged in the first direction; and each of gate structures is formed by at least one of first gate structures and at least one of the second gate structures.

5. The semiconductor structure according to claim 1, wherein the semiconductor channels are arranged at intervals in the first direction, and only one first face is provided between two adjacent second faces in the first direction; the first gate structures and the second gate structures are in a one-to-one correspondence with the semiconductor channels; each of the second gate structures is in contact with two adjacent first gate structures in the first direction; and
each of gate structures is formed by at least one of the first gate structures and at least one of the second gate structures.

6. The semiconductor structure according to claim 3, wherein the semiconductor channels are arranged at intervals in the second direction; the semiconductor channels arranged at intervals in the second direction are in a one-to-one correspondence with the gate structures; and spacings are provided between adjacent gate structures in the second direction.

7. The semiconductor structure according to claim 6, wherein adjacent semiconductor channels in the second direction are arranged centrosymmetrically or axisymmetrically;
each of the bit lines is contact with the semiconductor channels arranged at intervals in the second direction.

8. The semiconductor structure according to claim 6, wherein adjacent semiconductor channels in the second direction are arranged centrosymmetrically; every two adjacent semiconductor channels in the second direction define a reference structure; two second faces of the reference structure are located in the spacing between two first faces; the semiconductor structure further comprises:
first isolation layers in contact with both of two second L-shaped sidewalls in the reference structure; and
second isolation layers located between adjacent first isolation layers in the first direction;
the first isolation layers are in contact with the second isolation layers, and the first isolation layers and the second isolation layers are alternately arranged in the first direction.

9. The semiconductor structure according to claim 8, wherein a length of each one of the first isolation layers in the second direction is a first length; a length of each one of the second isolation layers in the second direction is a second length; and a ratio of the second length to the first length ranges from $\frac{1}{2}$ to $\frac{2}{3}$.

10. The semiconductor structure according to claim 3, wherein each of the gate structures comprises a gate dielectric layer and a gate; the gate dielectric layer is disposed on the first face and the second face; the gate dielectric layer is in a one-to-one correspondence with each one of the semiconductor channels; the gate dielectric layer has an L-shaped cross-section in the plane perpendicular to the third direction; and the gate is disposed on a side of the gate dielectric layer away from each one of the semiconductor channels.

11. The semiconductor structure according to claim 1, wherein each of the bit lines comprises a first sub-bit line and a second sub-bit line which are spaced from each other in the first direction and extend in the second direction; and the semiconductor structure further comprises insulation layers each located between the first sub-bit line and the second sub-bit line.

12. The semiconductor structure according to claim 1, wherein, a material of the semiconductor channels comprises silicon or silicon germanium.

13. The semiconductor structure according to claim 1, further comprising capacitive structures; wherein each of the capacitive structures is at least in contact with a side of a respective semiconductor channel away from the bit lines in the third direction.

14. A manufacturing method of a semiconductor structure, comprising:

forming semiconductor channels extending in a third direction, wherein each of the semiconductor channels has an L-shaped cross-section in a plane perpendicular to the third direction, each of the semiconductor channels comprises a first L-shaped sidewall and a second L-shaped sidewall which are opposite to each other and extend in the third direction, the first L-shaped sidewall comprises a first face extending in a first direction and a second face extending in a second direction;

forming first gate structures and second gate structures which are in contact with each other, wherein each of the first gate structures is in contact with the first face, each of the second gate structures is in contact with the second face, and forms a combined structure together with a respective one of the second gate structures, the combined structure has an L-shaped cross-section in the plane perpendicular to the third direction; and forming bit lines extending in the second direction and located on a side of each of the semiconductor channels in the third direction;

wherein the first direction, the second direction and the third direction intersect with each other.

15. The manufacturing method according to claim 14, wherein the forming the semiconductor channels comprises:

forming semiconductor columns arranged at intervals in at least one of the first direction or the second direction; and forming the semiconductor channels on sidewalls of the semiconductor columns extending in the third direction, with each of the semiconductor columns being in contact with two respective semiconductor channels, wherein the semiconductor channels are arranged in at least one of following ways:

(a) every two semiconductor channels in contact with a same semiconductor column are arranged centrosymmetrically, or (b) adjacent semiconductor channels in the first direction are arranged axisymmetrically.

16. The manufacturing method according to claim 15, wherein each of the semiconductor columns has a first side and a second side opposite to each other in the second direction, a length of each of the semiconductor columns in the second direction is a third length; after the semiconductor columns are formed and before the semiconductor channels are formed, the manufacturing method further comprises:

forming third isolation layers and fourth isolation layers alternately located between adjacent semiconductor columns in the first direction, wherein one of sidewalls of each third isolation layer which extends in the third direction is flush with the first side, a length of each of the third isolation layers in the second direction is less than the third length; one of sidewalls of each fourth isolation layer which extends in the third direction is flush with the second side, a length of each of the fourth isolation layers in the second direction is less than the third length; and forming the semiconductor channels on parts of sidewalls of the semiconductor columns extending in the third direction which are exposed by the third isolation layers and the fourth isolation layers.

17. The manufacturing method according to claim 16, wherein the semiconductor structure meets at least one of following requirements:

(a) a ratio of the length of each of the third isolation layers in the second direction to the third length ranges from ½ to ⅔, or (b) a ratio of the length of each of the fourth isolation layers in the second direction to the third length ranges from ½ to ⅔.

18. The manufacturing method according to claim 16, wherein, before the semiconductor columns are formed, the manufacturing method comprises:

providing a substrate; and forming an initial insulation layer on the substrate;

wherein the forming the semiconductor columns comprises: forming the semiconductor columns on a side of the initial insulation layer away from the substrate;

after the semiconductor channels are formed, the forming the bit lines comprises:

removing the semiconductor columns to form first grooves, and forming first isolation layers filled in the first grooves;

removing the third isolation layers and the fourth isolation layers;

etching the initial insulation layer through gaps provided between the adjacent semiconductor channels in the first direction, to form second grooves, wherein at least parts of bottom surfaces of the semiconductor channels facing the substrate are exposed from the second grooves, an orthographic projection of each gap on the substrate is located in an orthographic projection of a respective one of the second grooves on the substrate, remaining parts of the initial insulation layer form insulation layers; and forming the bit lines in the second grooves, with the bit lines being in contact with at least part of bottom surfaces of the semiconductor channels facing the substrate and exposed through the second groove, wherein each of the bit lines comprises a first sub-bit line and a second sub-bit line which are located respectively on two opposite sides of the respective insulation layer in the first direction, the first sub-bit lines and the second sub-bit lines extend in the second direction.

19. The manufacturing method according to claim 18, wherein after the semiconductor channels are formed, the forming the first gate structures and the second gate structures comprises:

forming second isolation layers covering parts of sidewalls of the first isolation layers extending in the third direction and exposed from the semiconductor channels, with each of the second isolation layers being connected to adjacent first isolation layers in the first direction, wherein sidewalls of the semiconductor channels and the second isolation layers which extend in the third direction together form a reference sidewall, the reference sidewall comprises a first region, a second region and a third region arranged in sequence in the third direction; and forming gate structures located in the second region, with each of the gate structures being in contact with a plurality of the semiconductor channels arranged at intervals in the first direction, wherein each of the gate structures comprises at least the first gate structure and the second gate structure.

20. The manufacturing method according to claim 14, wherein the bit lines are formed before the semiconductor channels, the first gate structures and the second gate structures are formed, and the forming the bit lines comprises:

providing a substrate and forming the bit lines on the substrate, with the bit lines extending in the second direction and being arranged at intervals in the first direction, wherein forming the semiconductor channels comprises: forming the semiconductor channels on sides of the bit lines away from the substrate, with a bottom surface of each semiconductor channel facing the substrate being in contact with a respective one of the bit lines.

* * * * *